United States Patent
Kim

[11] Patent Number: 5,420,870
[45] Date of Patent: May 30, 1995

[54] NON-FULLY-DECODED TEST ADDRESS GENERATOR

[75] Inventor: Hyoung Kim, Plainsboro, N.J.

[73] Assignee: AT&T Corp., Murray Hill, N.J.

[21] Appl. No.: 322,462

[22] Filed: Oct. 11, 1994

Related U.S. Application Data

[63] Continuation of Ser. No. 892,304, Jun. 2, 1992.

[51] Int. Cl.6 .............................................. G11C 29/00
[52] U.S. Cl. ...................................................... 371/27
[58] Field of Search .......................................... 371/27

[56] References Cited

U.S. PATENT DOCUMENTS 4,442,519  4/1984  Jones et al. ............................ 371/27
4,872,168  10/1989  Aadsen et al. ...................... 371/21.3
5,151,903  9/1992  Mydill et al. .......................... 371/27

Primary Examiner—Hoa Nguyen
Attorney, Agent, or Firm—Robert B. Levy

[57] ABSTRACT

An address count which increases up to, or decreases down from, a user-selected value is generated by a non-fully-decoded address generator (10) which is configured of a plurality of interconnected, sequentially-actuated of bit generators ($12'_1$–$12'_k$), each generating a separate one of the bits of the address count. Each of the bit generators is presettable to at least one logic state, with at least one bit generator being presettable to a separate one of two logic states. A control circuit (30' presets the bit generators in accordance to the user-selected initial value so that when the bit generators are sequentially actuated, their collective count runs up to, or down from, the seed value.

5 Claims, 2 Drawing Sheets

NON-FULLY-DECODED TEST ADDRESS GENERATOR

This application is a continuation of application Ser. No. 07/892,304, filed on Jun. 2, 1992, now abandoned.

TECHNICAL FIELD

This invention relates to a circuit for generating a count for addressing successive cells in a memory or the like.

BACKGROUND OF THE INVENTION

As present-day integrated circuits become more dense and more complex, conventional techniques for testing such circuits, which rely on sophisticated prior art testing machines for this purpose, are becoming increasingly less effective. For that reason, much attention is now being devoted to developing techniques for enabling an integrated circuit to test itself (built-in self-test). An example of a built-in self-test technique for a Random Access Memory (RAM) is disclosed in U.S. Pat. No. 4,872,168, issued on Oct. 3, 1989, in the names Duane R. Aadsen et al., and assigned to AT&T Bell Laboratories, the same assignee of the instant application. The Aadsen et al. test technique utilizes a test address generator for successively addressing individual cells within the RAM so that each cell can be written into, and read from, to verify its operation.

The test address generator presently employed to address successive cells in a RAM for self-testing typically employs a fully decoded counter. This type of counter operates by counting up to, or down from, a fixed binary value $2^k - 1$, where k is an integer. The disadvantage associated with this type of counter is that if the number of cells to be addressed is less than $2^k - 1$, the counter must still count up to, or down from, $2^k - 1$ even after all cells have been addressed. Thus, it becomes necessary to wait for the counter to complete counting before a subsequent testing operation can be accomplished. Depending on the difference between the counter count of $2^k - 1$ and the actual number of cells, the delay can be significant.

Thus, there is a need for a test address generator which can count up to and down from a user-selected value to increase test efficiency.

SUMMARY OF THE INVENTION

Briefly, in accordance with the invention, there is provided a non-fully-decoded test address generator for generating a count which increases up to, or decreases down from, a user-selected initial seed value. The test generator comprises a counter configured of a plurality of individual bit generators which sequentially actuate each other to collectively generate a successively changing count. At least one of the bit generators in the counter is initializable to either a binary one or zero condition so as to allow the bit generators to count up to or down from a value other than $2^k - 1$. The individual bit generators of the counter, which each generate a bit indicative of a separate one of the bits of the address count, are controlled by a controller which serves to initialize each of the generators to establish the counter seed value.

DETAILED DESCRIPTION

Figure 1:
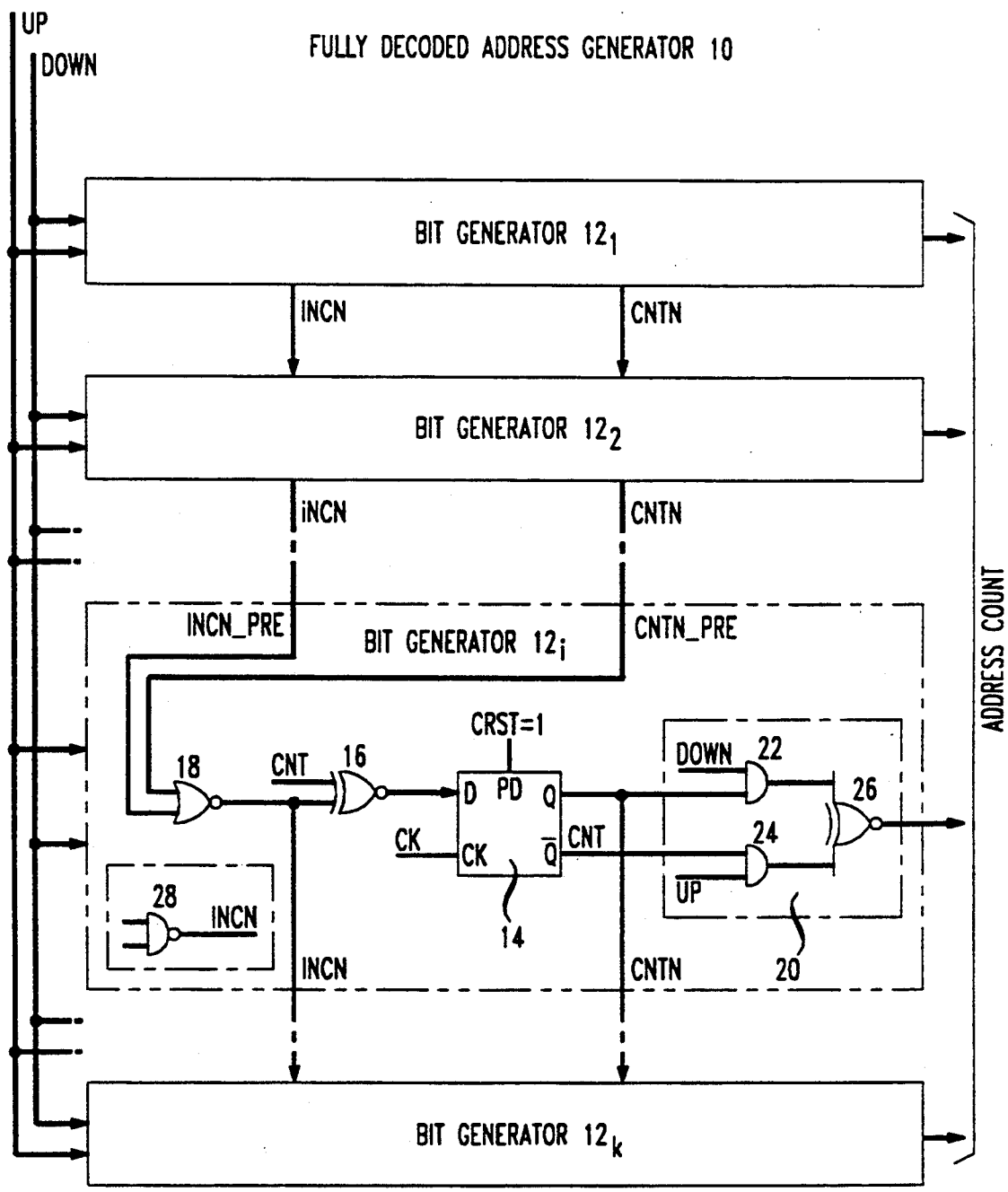
FIG. 1 is a block schematic diagram of a prior art test address generator which is comprised of a plurality of fully decoded bit generators.

FIG. 1 is a block schematic diagram of a fully decoded test address generator 10 according to the prior art for generating an address count which either increases to, or decreases from, a value of $2^k - 1$ (where k is a integer greater than zero) for the purpose of addressing successive memory cells (not shown). The address generator 10 is comprised of k separate bit generators $12_1, 12_2 \ldots 12_i \ldots 12_k$, each generating a separate one of the bits of the address count. Each of the bit generators $12_1-12_k$ is of the same construction and, therefore, only the details of the bit generator $12_i$ have been illustrated.

The bit generator $12_i$ comprises a D-type flip-flop 14, typically a model FD 1S3JX high-speed CMOS flip-flop manufactured by AT&T Microelectronics, Allentown, Penn. The flip-flop 14 has its D input supplied with the output signal of an exclusive NOR (XNOR) gate 16, the first input of which is supplied with a signal CNT produced at the $\overline{Q}$ output signal of the flip-flop. The second input of the XNOR gate 16 is coupled to the output of a NOR gate 18 supplied at each of its two inputs with a separate one of a pair of signals, CNTN_PRE and INCN_PRE, representing the count (CNTN) and count increment (INCN) signals, respectively, of the immediately preceding bit generator $12_i-1$. The CNTN_PRE signal received by the bit generator $12_i$ corresponds to the CNTN signal produced at the Q output of the flip-flop 14 of the bit generator $12_i-1$. The INCN_PRE signal received by the bit generator $12_i$ corresponds to the INCN signal produced at the output of the NOR gate 18 of the bit generator $12_i-1$. With respect to the first bit generator $12_1$, the INCN_PRE and CNTN_PRE signals are supplied by an external signal generator (not shown).

The signals CNTN and CNT generated at the $\overline{Q}$ and Q output of the flip-flop 14, respectively, are supplied to a test address logic gate 20 which logically combines these two signals with a pair of externally supplied signals UP and DOWN. The signals UP and DOWN are each separately asserted to cause the bit generators $12_1-12_k$ collectively to count up from zero to $2^k - 1$ or down from the value of $2^k - 1$ to zero, respectively. The logic gate 20 comprises a pair of AND gates 22 and 24, each logically ANDING a separate one of the signals CNTN and CNT with the DOWN and UP signals, respectively. A NOR gate 26 logically NORs the output signals of the AND gates 22 and 24 to yield a single bit output signal, representing a separate one of the bits of the count of the address counter 10.

At the outset of operation, each of the bit generators $12_1, 12_2 \ldots 12_k$ is initially reset by the application of a logic "1" reset signal (CRST) to the bit generator's flip-flop 14 at its PD input. In this way, the CNTN signal of each flip-flop 14 is set to a logic "1" level. As a consequence, the CNTN_PRE signal received by each of the bit generators $12_2, 12_3 \ldots 12_k$ is a logic "1" level at this instant in time. The CNTN_PRE and INCN_PRE signals supplied to the first bit generator $12_1$ are held at a logic "0" so that the INCN signal produced at the NOR 18 gate of this bit generator becomes a logic "1".

With the output signal of the NOR gate 18 of the bit generator $12_1$ at a logic "1" level, and the CNT signal of the flip-flop 14 of this bit generator at a logic "0" level (owing to the fact that flip-flop has been preset), the output signal of the XNOR gate 16 will be a logic "0". Under these conditions, the bit generator $12_1$ will output a logic "1" or logic "0" count bit, depending on whether the UP or DOWN signal, respectively, is asserted.

When the INCN_PRE and CNTN_PRE signals from the bit counter $12_1$ are both at a logic "1", the NOR gate 18 of the bit generator $12_2$ produces a logic "0" output signal. The combination of the logic "0" signal from the NOR gate 18 of the bit generator $12_2$, together with a logic "0" CNT signal from the flip-flop 14 of this bit generator, causes the XNOR gate 16 of this bit generator to produce a logic "1" output signal. As a consequence, the flip-flop 14 of the bit generator $12_2$ toggles, causing the CNTN signal at Q output of the flip-flop 14 to change to a logic "0". Depending on which of the signals UP and DOWN is asserted, the bit generator $12_2$ will produce a count bit at a logic "1" or "0", respectively.

Upon being supplied with an INCN_PRE signal and a CNTN_PRE signal at a logic "1" and a logic "0", respectively, from the bit generator $12_2$, the bit generator $12_3$ (not shown) supplies the next succeeding bit generator $12_4$ (not shown) with a an INCN_PRE signal and a CNTN_PRE, each at a logic "0" level. As a consequence, the bit generator $12_4$, when supplied with INCN_PRE and CNTN_PRE signals at these levels, will produce a logic "1" and logic "0" INCN_PRE and CNTN_PRE signals, respectively. The particular state of the INCN_PRE and CNTN_PRE signals supplied by each of the bit generators $12_2 \ldots 12_{k-1}$ causes each of the succeeding bit generators $12_{3-12k}$, respectively, to generate a count bit at a logic "1" or "0" depending on whether the DOWN or UP signal, respectively, is asserted. Thus, at the outset of operation, the collective count of the address generator will be 0,0,0...0 or 1,1,1...1, assuming that the bit from the bit generator $12_1$ represents the least significant bit of the count.

To increment the count of the counter 10, the INCN_PRE signal supplied to the bit generator $12_1$ is made to change state, causing the flip-flop 14 of this bit generator to toggle so that the signal CNTN changes state. Accordingly, the output count bit of the bit generator $12_1$ now change states. The change in state of the CNTN signal of bit generator $12_1$, together with the change in state of the INCN signal, prevents the flip-flop 14 of the bit generator $12_2$ from toggling, which, in turn, prevents each of the successive bit generators $12_3 \ldots 12_k$ from changing their respective output bit counts. In this way, the collective count of the bit generators $12_1$–$12_k$ changes by a single binary "1" value, either up or down, depending on whether the up or down signal is asserted.

When the INCN_PRE signal supplied to bit generator $12_1$ is made to change state again, the output count bit of the bit counter $12_1$ changes. Also, the output count bit of the next successive bit generator (i.e., bit generator $12_2$) also changes, but the output bits of the remaining bit generators $12_3$–$12_k$ remain unchanged. Thus, the collective count of the bit generators $12_1 \ldots 12_k$ changes by a single binary "1" value. Each time the INCN_PRE signal supplied to the bit generator $12_1$ changes state, the collective count of the address generator changes.

As thus described, the bit generators $12_1 \ldots 12_k$ of the address generator 10 collectively operate to generate an even count. However, the address generator 10 can be made to generate an odd count by altering the structure of one or more of the bit generators, such as the bit generator $12_i$, to make the generator "odd". The bit generator $12_i$ can be made odd by substituting a NAND gate 28 for the NOR gate 18. In addition to substituting the NAND gate 28, the signal CNTN_PRE that was previously supplied to the NOR gate is replaced by a signal CNT_PRE (corresponding to the signal CNT generated by the flip-flop 14 of the bit generator $12_{i-1}$. By substituting the NAND gate 28 for the NOR gate 18, and by replacing the CNTN_PRE signal with the signal CNT_PRE, the bit generator $12_i$ will generate a count bit whose state is exactly the inverse of that generated by an even bit generator.

Figure 2:
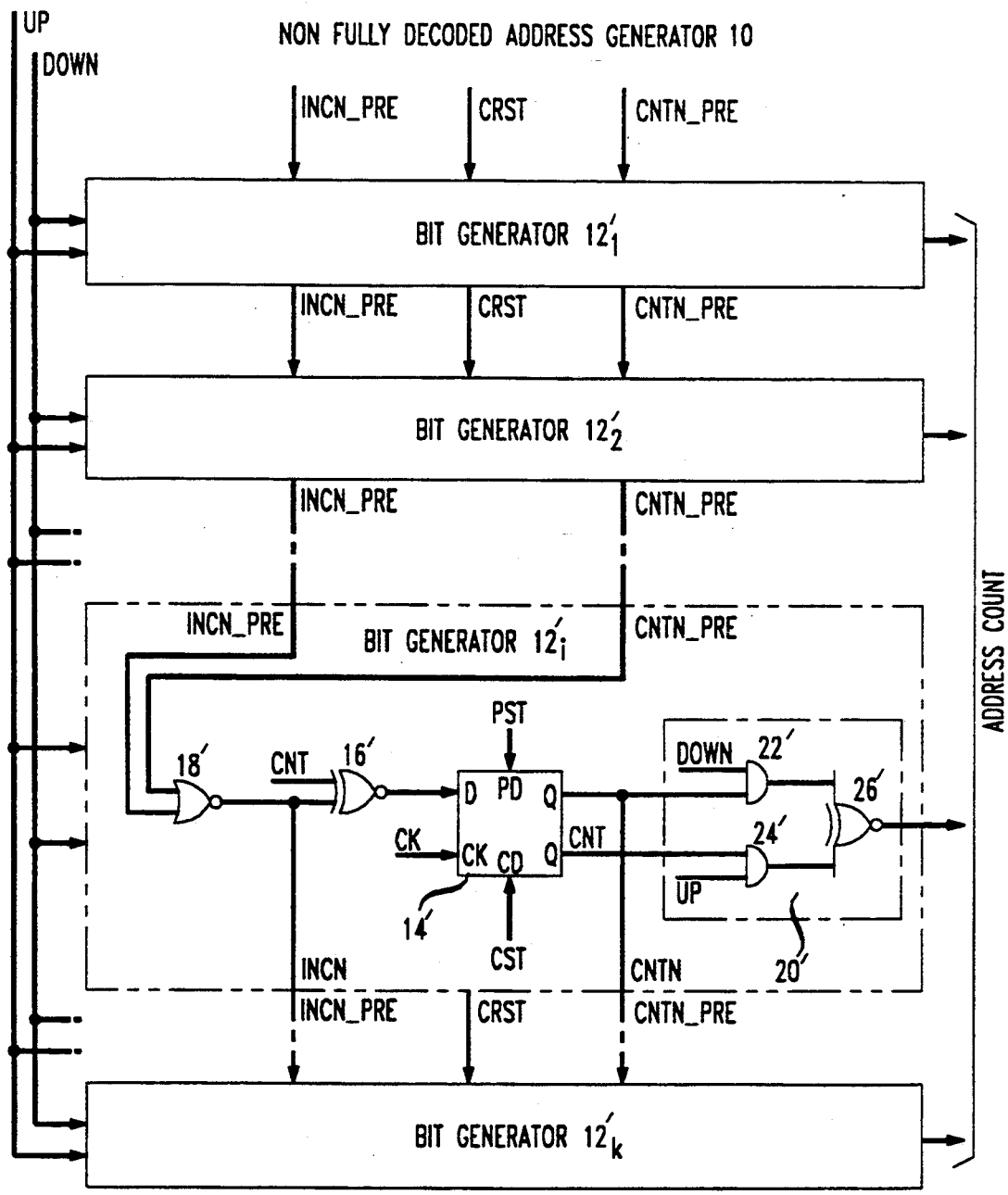
FIG. 2 is a block schematic diagram of a non-fully-decoded test address register according to the invention.
Figure 2:
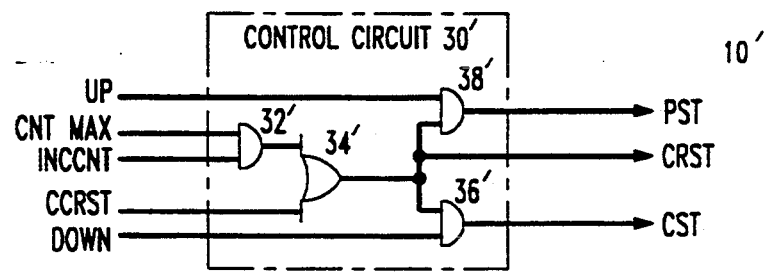

The disadvantage of the address counter 10 thus described is that the counter generates a count that increases to, or decrease from, a value of $2^k-1$. However, in many instances, it is desirable to count to a user-selected value different from $2^k-1$. Referring now to FIG. 2, there is shown a block schematic diagram of a non-fully-decoded address counter 10', in accordance with a preferred embodiment of the invention, for generating a count which increases up from zero or down to zero from a user-selected value which is typically different from $2^k-1$. Referring to FIG. 2, the address generator 10' comprises a plurality of bit generators $12'_1, 12'_2 \ldots 12'_i \ldots 12'_k$, each generating a separate bit of an address count, together with a control circuit 30' for controlling the bit generators.

Each of the bit generators $12'_1$–$12'_k$ has the same general structure as the bit generator $12_i$ of FIG. 1, in that each bit generator of FIG. 2 (e.g., bit generator $12'_i$) has a flip-flop 14', a XNOR gate 16', a NOR gate 18', and a test address logic gate 20' connected in the same manner. Each of the bit generators $12'_1$–$12'_k$ operates in a manner identical to that described for the bit generators $12_1$–$12_k$ of FIG. 1. Therefore, the bit generators $12'_1$–$12'_k$ sequentially actuate each other when the INCN_PRE signal to first bit generator $12'_1$ changes state.

However, the test address generator 10' of FIG. 2 differs from the generator 10 of FIG. 1 in that at least one of the bit generators $12'_1$–$12'_k$ of FIG. 2 (i.e., bit generator $12'_i$) is provided with a flip-flop 14' which is presettable to either a logic "1" or a logic "0" value. Typically, the flip-flop 14' comprises a model FD1S3OX high-speed CMOS D-type flip-flop manufactured by AT&T Microelectronics. In contrast, the flip-flop 14 of each bit generator of FIG. 1 (e.g., bit generator $12_i$), as well as those in selected ones of the bit generators $12'_1$–$12'_k$ (other than the bit generator $12'_i$), can only be preset to a logic "1" level.

There is a distinct advantage to configuring one or more of the bit generators $12'_1$–$12'_k$ of the address generator 10' with a flip-flop 14' that is presettable to either a logic "1" or "0". Selectively presetting the flip-flop 14' within one or more of the bit generators $12'_1$–$12'_k$ to a particular state allows the count of the address generator 10' to increase to, or decrease from, a seed value other than $2^k-1$. By appropriately presetting selected ones of the bit generators $12'_1$–$12'_k$, the seed value count of the address counter 10' can set to any preferred user value.

To determine which of the bit generators $12'_1$–$12'_k$ should be configured to include a flip-flop 14' which can be preset to a logic "1" or "0", the following algorithm can be employed. First the initial seed value (w) is selected. Next, the binary value of w−1 is computed. For each individual binary bit (n) of the binary value of w−1, a check is made whether the bit is a binary "1" or a binary "0". If the bit is a binary "1", then the corresponding bit generator $12'_n$ utilizes a conventional flip-flop 14. Conversely, if the bit is a binary "0", then the bit generator is provided with a flip-flop 14' which can be preset to either a logic "1" or a logic Referring to FIG. 2, the address generator 10' includes a control circuit 30' which serves to preset each flip-flop 14' within each of the bit generators $12'_1$–$12'_k$. The control circuit 30' includes a first AND gate 32' which logically ANDS a pair of externally supplied signals CNTMAX, and INCCNT. The signal CNTMAX, referred to as the maximum count value, is generated by logically ANDing the UP signal with the value of w, and then logically ANDing the DOWN signal with the a logic "0". The results of each of these AND operations are logically OR'd to yield the CNTMAX signal. The INCCNT signal corresponds to the increment count signal (INCNT_PRE) externally supplied to first bit generator $12_1$.

The output of the AND gate 32' is supplied to the first input of an OR gate 34'. The OR gate 34' logically OR's the AND gate 32' output signal with an externally supplied counter reset signal CCRST to generate the reset signal CRST, which is supplied to each of those bit generators $12'_1$–$12'_k$ (e.g., other than the bit generator $12'_i$) which contain a flip-flop 14 that is presettable only to a logic "1" level. The output of the OR gate 34' is supplied to a first input of an AND gate 36' and to the first input of an AND gate 38'.

The AND gate 36' logically ANDs the CRST signal generated by the OR 34' gate with the externally-supplied DOWN signal to yield a signal CST. The signal CST is supplied to each bit generator, such as the bit generator $12'_i$, which has a flip-flop 14' that is presentable to a logic "1" or "0" to preset the flip-flop to a logic "0" state. In a preferred embodiment of the bit generator $12'_i$, the CST signal is supplied to the flip-flop 14's CD input. The AND gate 38' logically ANDs the CRST signal from the OR gate 34' with the externally supplied UP signal. When supplied with the UP signal and the CRST signal, the AND gate 38' produces a signal PST at its output which is supplied to each bit generator, such as the bit generator $12'_i$, which has a flip-flop 14' that is presettable to a logic "1" or "0" to preset the flip-flop to a logic "1" state. In a preferred embodiment of the bit generator $12'_i$, the PST signal is supplied to the flip-flop's PD input.

As may thus be appreciated, the control circuit 30' advantageously controls the presetting of the bit generators $12'_1$–$12'_k$, including those having a flip-flop presettable to a logic "1" or "0" level. In this way, the control circuit 30' presets or initializes the bit generators $12'_1$–$12_k$ to enable the address generator 10' to count up from zero or down to zero from the user-selected seed value.

It is to be understood that the above-described embodiments are merely illustrative of the principles of the invention. Various modifications and changes may be made thereto by those skilled in the art which will embody the principles of the invention and fall within the spirit and scope thereof.

I claim:

1. An address generator for generating bits that form an address count which increases to, or decreases from a user-selected initial seed value, comprising:

counter means, including a plurality of bit generators interconnected in daisy chain fashion, each bit generator including a flip-flop and logic circuitry, a first one of the bit generators being responsive to external signals for generating first and second actuating signals to actuate a successive bit generator and for generating a bit in response to said external signals, each successive bit generator generating first and second actuating signals for actuating a successive bit generator and also generating a bit in response to the first and second actuating signals from a preceding bit generator, the bits of the bit generators forming an address count that runs between zero and a user-selected initial seed value, the bit generators each being presettable to only a first prescribed logic state to generate a bit at said first prescribed logic state, except for at least one bit generator being presettable to said first prescribed logic state or to a second prescribed logic state to cause said one bit generator to generate a bit at said first or and said second prescribed logic states, respectively, so that said bit generators, when preset, establish the user-selected initial seed value; and counter control means for presetting each of the bit generators so that the address count runs between zero and the user-selected initial seed value.

2. The apparatus according to claim 1 wherein the flip-flop in each bit generator comprises:

a presettable D-type flip-flop for generating first and second output signals, the flip-flop being presettable to at least said first prescribed logic state to produce an first output signal at one of its, first and second outputs corresponding to said first prescribed logic state, said first output signal of the D-type flip-flop serving as the first actuating signal; and wherein the logic circuit includes:

a NOR gate for logically NORing the first and second actuating signals received from the preceding bit generator to generate the second actuating signal;

an exclusive NOR gate for exclusively NORing the output signal of the NOR gate with the first output signal of the D-type flip-flop to generate a signal applied to the flip-flop; and logic gate means for logically combining the first and second output signals of the D-type flip-flop with each of a pair of eternally provided UP and DOWN signals, respectively, said UP and DOWN signals are at a first logic level when the address generator is to count up and down, respectively, to generate the count bit wherein said externally provided UP and DOWN signals constitute said external signals.

3. The apparatus according to claim 2 wherein the flip-flop in each bit generator is presettable to either of said first or second prescribed logic states.

4. The apparatus according to claim 1 wherein the counter control means comprises:

a first AND gate for logically ANDing a first externally supplied signal of said external signals, indicative of the initial seed value, and a second externally supplied counter increment signal which constitutes another of said external signals;

a first OR gate for ORing the output signal of the first AND gate with an externally supplied reset signal to produce a first preset signal for presetting each bit generator which is presettable to at least said first logic state;

a second AND gate for ANDing the first preset signal produced by said first OR gate with an externally provided DOWN signal, which is asserted when the address generator is to count down, to generate a second preset signal;

an inverter for inverting the DOWN signal and for generating an output; and a third AND gate for logically ANDing the first preset signal with the output signal of the inverter to yield a third preset signal, the second and third preset signals for presetting each bit generator that is presettable to either the first or second logic state.

5. A method for generating a count which runs between zero and an initial user-selected initial seed value comprising the steps of:

providing a plurality of bit generators interconnected in daisy-chain fashion, each bit generator including a flip-flop and associated logic Circuitry for generating first and second actuating signals and also generating a bit in response to the first and second actuating signals from a preceding bit generator, the bits of the bit generators representing an address count that runs between zero and an initial user-selected seed value, with the first bit generator being responsive to external signals, the bit generators each being presettable to only a first prescribed logic state to generate a bit at said first prescribed logic state except for at least one bit generator being presettable to said first prescribed logic state or to a second prescribed logic state to cause said one bit generator to generate a bit at said first or second prescribed logic states, respectively so that said bit generators, when preset, establish the user-selected initial seed value;

presetting the bit generators to preset at least one bit generator to either a first or second logic state and to preset each remaining bit generator to said first prescribed logic state; and sequentially actuating the bit generators to successively change their bits, with the first bit generator being activated by said external signals, and each successive bit generator activated by each preceding bit generator, so the count formed by the bits, when the bit counters are sequentially actuated, runs between the user-selected initial seed value and zero.

* * * * *